United States Patent [19]

Hazendonk et al.

[11] Patent Number: 4,584,697
[45] Date of Patent: Apr. 22, 1986

[54] FOUR-PHASE CHARGE-COUPLED DEVICE HAVING AN OVERSIZED ELECTRODE

[75] Inventors: Teunis J. Hazendonk, Sunnyvale, Calif.; Arend J. Klinkhamer, Eindhoven, Netherlands; Gerard A. Beck, Eindhoven, Netherlands; Theodorus F. Smit, Eindhoven, Netherlands

[73] Assignee: U.S. Philips Corporation, New York, N.Y.

[21] Appl. No.: 713,582

[22] Filed: Mar. 19, 1985

Related U.S. Application Data

[63] Continuation of Ser. No. 385,948, Jun. 7, 1982, abandoned.

[30] Foreign Application Priority Data

Jun. 5, 1981 [NL] Netherlands ............... 8102719

[51] Int. Cl.$^4$ .................. G11C 19/28; H01L 29/78
[52] U.S. Cl. ........................................ 377/60; 357/24
[58] Field of Search ................. 357/24; 377/57–63

[56] References Cited

U.S. PATENT DOCUMENTS

| | | | |
|---|---|---|---|
| 3,971,003 | 7/1976 | Kosonocky | 357/24 |
| 3,986,059 | 10/1976 | Mohsen | 357/24 |
| 4,243,897 | 1/1981 | Fujishima et al. | 357/24 |

*Primary Examiner*—Gene M. Munson
*Attorney, Agent, or Firm*—Robert T. Mayer; Steven R. Biren

[57] ABSTRACT

In a 4-phase CCD with 90° overlap of the clock voltages, the area below two clock electrodes may be used for the storage of charge packets which thus can be 2× as large as in conventional modes of operation. By choosing the penultimate electrode before the reading stage to be approximately 2.5× as large as the other electrodes, this double charge packet can be transferred undivided in time to the output diode, a feature which is particularly advantageous for further signal processing.

5 Claims, 4 Drawing Figures

FOUR-PHASE CHARGE-COUPLED DEVICE HAVING AN OVERSIZED ELECTRODE

This is a continuation of application Ser. No. 385,948, filed June 7, 1982, now abandoned.

BACKGROUND OF THE INVENTION

The invention relates to a semiconductor device comprising a 4-phase charge-coupled device having a semiconductor body a surface of which comprises a row of electrodes to which clock voltages can be applied for storing and transferring electric charge packets. The electrodes are arranged in groups of four, the first electrode of each group being connected to a first clock line, the second electrode being connected to a second clock line, the third electrode being connected to a third clock line and the fourth electrode being connected to a fourth clock line. The last electrode of the row is connected to a separate connection and is present beside a reading stage, the capacitance of which is sufficiently large to comprise the maximum charge packet which can be stored below two adjacent electrodes.

In conventional charge-coupled devices, the reading stage is formed by the output. The usual output structure comprises an output zone or diode which is usually connected to the gate electrode of a MOST-follower and can be set at a given potential via a resistor or a reset switch. The last electrode which is present before the output zone is usually termed the output gate and is preferably set at a fixed potential. In the case of an n-channel CCD, said potential is near the most negative potential of the transport clock voltages, and, in the case of a p-channel CCD, it is near the most positive potential of the clock voltages. As a result of this the crosstalk of the clock voltages on the output signal can be reduced. Moreover, since each charge is stored in the output diode, the output capacity is kept restricted.

It is to be noted that the reading stage need not necessarily coincide with the output structure of the device but that a part of the register may be present between the reading stage and the output. Moreover, the output capacitance may be formed by a MOS-capacitor instead of by a diode, the insulated gate of said MOS being connected to the MOST-follower.

In the conventional mode of operation of a 4-phase CCD one charge packet the value of which is determined inter alia by the value of the electrode, can be handled per four electrodes. In the book "Charge Transfer Devices" by C. H. Séquin and M. F. Tompsett, edited by Academic Press, New York, 1975, pp. 64/65 it is stated that the charge capacitance (signal value) can be doubled by using overlapping clock voltages so that charge can always be stored below two juxtaposed electrodes.

SUMMARY OF THE INVENTION

A particular object of the invention is to provide a reading or output structure adapted to said mode of operation with which an improved reading of the charge packets can be obtained.

A charge coupled device having the features described above is characterized according to the invention in that the penultimate electrode before the reading stage forms with the underlying part of the semiconductor body a capacitance which is also sufficiently high to comprise the said maximum charge packet before charge is transferred to the reading stage.

For explanation of the discovery on which the invention is based there will first be described what happens in a usual output structure when overlapping clock voltages are used.

By applying such clock voltages, charge can always be stored below two adjacent electrodes so that the value of the charge packets can be double that of the charge packets when only one full "bucket" can occur in every four empty buckets. The double charge packets can be transported in the direction of the output and finally arrive in the area below the last two electrodes before the output gate. As long as a potential minimum is present below both electrodes, the whole charge packet can still be stored. At a given instant, however, the potential minimum below the first electrode disappears so that the double charge packet is stored below the second electrode, that is the penultimate electrode viewed from the output diode. When the charge packet has a maximum value, charge can now flow to the output diode via the potential barrier below the output gate until the potential below the penultimate electrode has reached the level of the potential below the output gate. The remainder of the charge will be transferred to the output diode when the clock voltage at the penultimate electrode is varied.

In the usual output structure, the charge packet will arrive in the output capacitance thus divided in time, which often is unfavorable for the further signal processing.

By using an output structure according to the invention the maximum (double) charge packet can be stored below the said penultimate electrode with a suitably chosen fixed voltage at the output gate, and can be transferred totally to the output diode or read out capacity at any instant deemed suitable.

A simple preferred embodiment is characterized in that the capacitance formed by the penultimate electrode with the semiconductor body is larger than $2\times$ the capacitance which the preceding electrodes formed with the semiconductor body. In this embodiment, for a given clock voltage, a slightly lower potential barrier can be formed below the output gate than below the preceding electrodes, while nevertheless all charge remains below the penultimate electrode.

Because the size of the capacitance is again decisive of the frequency characteristic of the device, the penultimate electrode is preferably formed so that it forms a capacitance which is at most $3\times$ larger than the capacitance which the preceding electrodes form with the semiconductor body.

BRIEF DESCRIPTION OF THE DRAWING

An embodiment of the invention will be described by way of example with reference to the associated diagrammatic drawings, in which:

FIG. 3 shows diagrammatically the potential distribution in the semiconductor body at the clock voltage shown in FIG. 2a.

DESCRIPTION OF THE PREFERRED EMBODIMENTS

Figure 1:
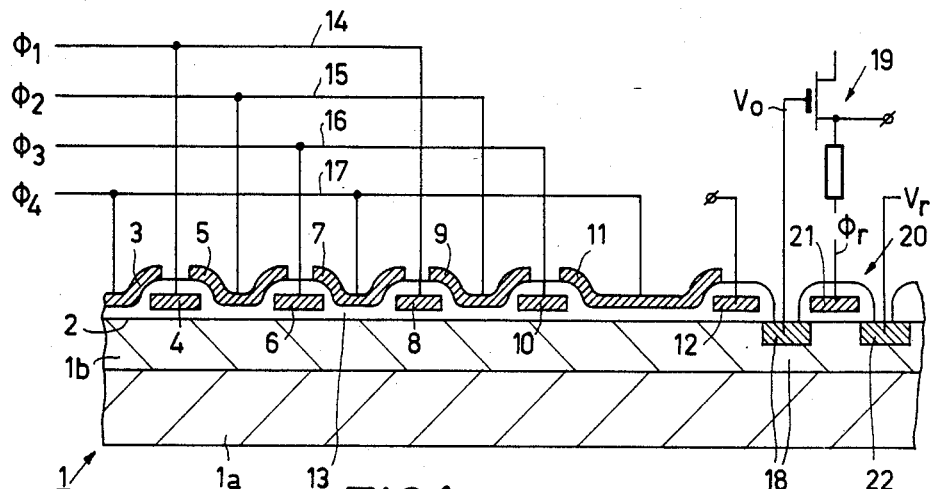
FIG. 1 is a cross-sectional view of a 4-phase CCD in accordance with the invention.

FIG. 1 is a diagrammatic cross-sectional view of a part of a charge-coupled device in accordance with the invention, namely that part which is of importance for the invention and comprises a reading stage which in the present embodiment coincides with the output of the charge-coupled device. The part which is not shown in the drawing and which may comprise an electrical input may be of any conventional structure.

The charge-coupled device described is of a type in which the charge transport takes place—at least substantially—via the interior of the body 1, which type is often known in the literature as pccd or bccd. Although the invention may also be used for so-called surface ccd's, the invention presents particular advantages when using such bulk ccd's due to the increased charge handling capability which in conventional bulk ccd's is comparatively low.

The device comprises a semiconductor body 1, which in a specific embodiment is of silicon, but which may alternatively be of any other suitable semiconductor material, for example Ga As.

The body 1 comprises a substrate 1a of one conductive type, for example the p-type, which, by means of epitaxy or ion implantation, is provided with an n-type surface layer over the whole thickness of which a depletion region can be formed for bulk transport of electrons.

A series of electrodes 3–11 is provided on the surface 2 of the semiconductor body, for example, in a known usual overlapping 2-layer polycrystalline-silicon configuration. Of course, the electrode may also be constructed in a 3-layer polycrystalline-silicon technique. Moreover, instead of polycrystalline-silicon for the electrodes, a metal silicide or aluminum may be used, for example, for the electrodes 3,5,7,9, and 11.

Between the semiconductor body 1 and the electrodes 3–12 a dielectric 13 is present which in the specific embodiment described may comprise a layer of silicon oxide in a thickness of approximately 1000Å, but which may also comprise layers of other material, for example, silicon nitride. In other constructions, in particular those in which a suitable metal is chosen for the electrodes, the layer 13 in the embodiment described may also be replaced by a rectifying Schottky junction to be biased in the reverse direction.

In order to make the device suitable for 4-phase operation, the electrodes 3–12 are arranged in groups of four, the electrodes 4 and 8 being connected to a first clock line 14, the electrodes 5 and 9 being connected to a second clock line 15, the electrodes 6 and 10 being connected to a third clock line 16 and the electrodes 3,7 and 11 being connected to the fourth clock line 17.

Succeeding the electrode 11, a reading stage is provided which in the present embodiment coincides with the output via which the charge packets are drained from the device. In other embodiments, however, the reading stage may also be present in front of the output and be separated therefrom by a part of the register. The output (or reading stage) is of any conventional construction an comprises a region 18 in which the charge packets to be read are collected. This region is connected at one end to the gate of a follower circuit 19 for reading out the output voltage Vo, at the other end via a MOST switch 20 to a voltage source which supplies the reference voltage Vr. The MOST switch 20 comprises the region 18 as a source, the electrode 21 as insulated gate electrode, and the zone 22 connected to the voltage source Vr as drain zone.

As will be explained in detail hereinafter, clock voltages $\phi_1$–$\phi_4$ can be applied to the clock voltage electrodes 3–11 that charge can be stored below two adjacent electrodes. The capacitance of the reading region is chosen to be so large that at the applied voltages such a charge packet can be fully stored in the region 18. In accordance with the invention, the penultimate electrode 11 which is present before the region 18 forms with the underlying part of the semiconductor body 1b a capacitance which is also sufficiently high to comprise such a charge packet before the charge is transferred to the region 18. In order to prevent premature transport to the zone 18 the capacitance which the electrode 11 forms with the region 1b is chosen to be larger than the sum of the capacitance which every two adjacent electrodes of the series 3–10 forms with the region 1b.

The capacitance which the electrode 11 forms with the region 1b can be adjusted in different manners which may be used individually or in combination with each other. For example, at the area of the electrode 11 the doping concentration may be increased, as a result of which the charge packet is stored closer to the surface 2. In the present embodiment, however, the increase in capacitance is obtained by a suitable choice of the dimensions of the electrode 11. In this connection it is to be noted that "electode" is to be understood to include mainly those parts of the conductor tracks which are present immediately above the charge transport channel 1b and which are operative as a storage/transport electrode. Those parts of the conductor tracks which, viewed in projection, are not present above the charge transport channel or those parts of the electrode 3,5,7,9 and 11 of the second layer which overlap the first layer electrodes 4,6,8 and 10 are not considered among the effective part of the electrodes.

In the FIG. 1 embodiment the electrodes 3–10 are approximately equally large. The electrode 11 is at least 2×larger than the electrodes 3–10. In order on the one hand to prevent too large a dimension of the electrode 11 from influencing the transport rate of the device disadvantageously, and on the other hand to enable the desired freedom of choice in the voltages which are applied to the electrode 12, the electrode 11 has been made approximately 2.5 times as large as the electrodes 3–10.

Figure 2A:
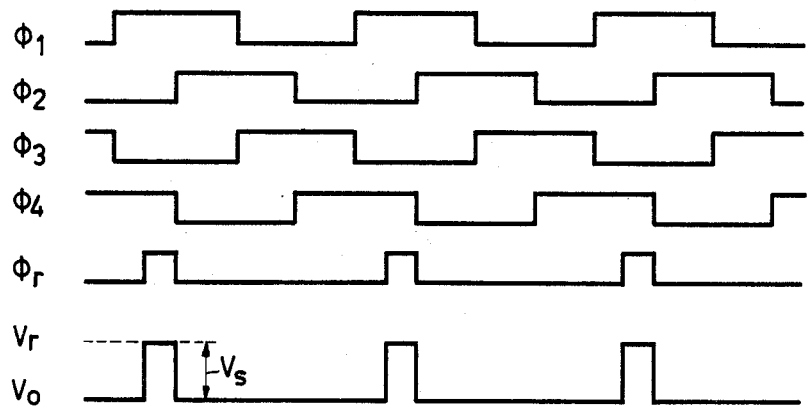
FIG. 2a shows a diagram of the clock voltages $\phi$ applied during operation and the output voltage Vo.
Figure 2B:
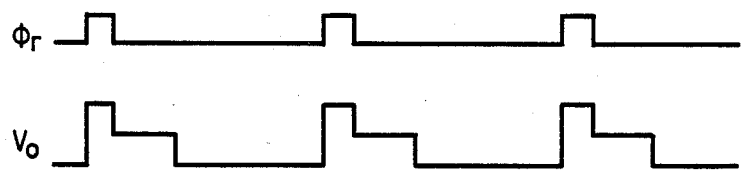
FIG. 2b shows the clock voltage $\phi_r$ which is used in a known 4-phase CCD during operation and the output voltage Vo.
Figure 3:
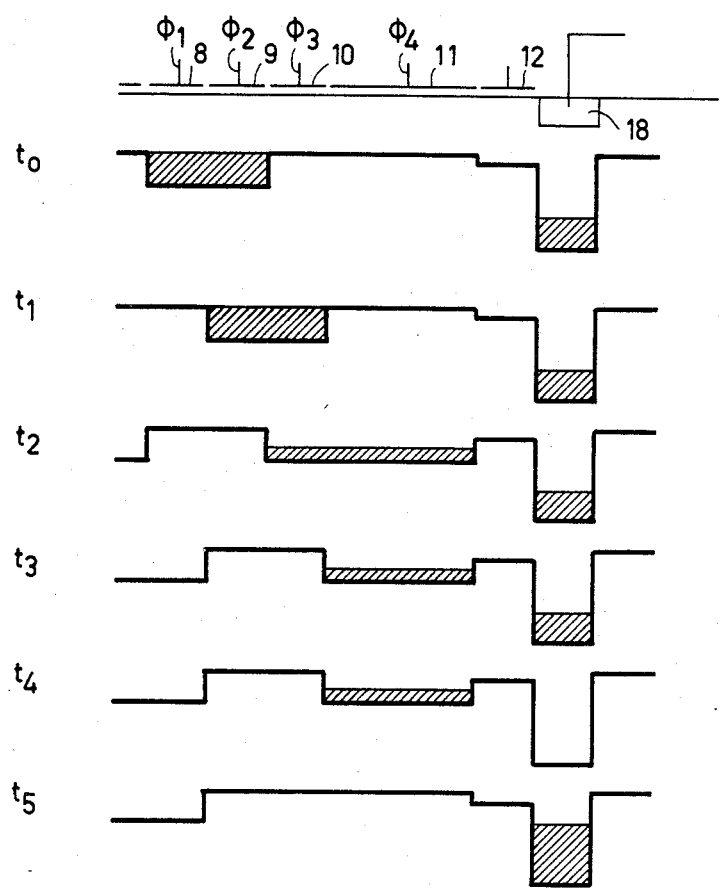

For the operation of the device reference is made to FIGS. 2a and 3, FIG. 2a showing the clock voltages $\phi_1$–$\phi_4$, the clock voltage $\phi_r$ on the electrode 21, and the output voltage Vo, FIG. 3 showing the potential distribution occuring in the semiconductor body. For comparison, FIG. 2b shows the voltage $\phi$ and the output voltage Vo in a 4-phase CCD with a usual output structure.

In the embodiment described, a CCD having an n-type bulk channel in which the charge packets in the form of electrons are moved through the layer 1b, the charge is stored below the electrodes having the most positive voltage. The clock voltages $\phi_1$, $\phi_2$, $\phi_3$ and $\phi_4$ overlap each other at least 90° in phase, as shown in FIG. 2a, so that at any instant at least two adjacent electrodes are "on" and the capacitance of two juxtaposed electrodes per charge packet can be used. At the instant to, for example, $\phi_1$ and $\phi_2$ are positive, $\phi_3$ and $\phi_4$ are negative. It is shown in FIG. 3 that at this instant a shaded charge packet is stored below the electrodes 8 and 9. This charge packet, when using overlapping clock electrodes, is double with respect to charge packets which, in the case of non-overlapping clock voltages of the same amplitudes can be stored below only one electrode.

At t1, $\phi_2$ and $\phi_3$ are positive, while $\phi_4$ and $\phi_1$ are negative; in this situaion the charge packet is present below the electrodes 9 and 10 (see FIG. 3).

At t2, $\phi_3$ and $\phi_4$ are positive, and $\phi_1$ is negative. The charge packet is now stored below the electrodes 10 and 11.

At t3, $\phi_4$ and $\phi_1$ are positive and $\phi_2$ and $\phi_3$ are negative. The whole charge packet is present only below the electrode 11. When the effective - area of the electrode 11 is at least 2× as large as that of the electrodes 3–10, the whole charge packet, with the full negative voltage at the electrode 12, could be stored below the electrode 11 without the charge packet moving partly to the read-out region 18. Since the area of the electrode 11 has been chosen to be even larger, namely approximately 2.5× as large as that of the preceding electrodes, the potential pit generated below the electrode 11 will not be filled entirely. As a result of this it is possible not to set up the full negative voltage at the electrode 12 but rather a slightly lower voltage so that the potential barrier below the electrode 12 is slightly larger than below the electrode 10 without charge flowing to the region 18. As long as the voltage at the electrode 11 does not vary, the region 18 may be used for reading a preceding signal, which is also shown shaded.

At t4 a positive voltage $\phi_r$ is set up at the electrode 21 so that the transistor 20 is on and the region 18 is connected to the reset voltage Vr. The charge packet which is stored in the region 18 is now removed via the transistor 20 so that the region 18 is again ready for storing the charge packet which is present below the electrode 11. Simultaneously with the clock pulse $\phi_r$ the input of the source-follower circuit 19 obtains the zero signal $V_r$.

At t5 the voltage $\phi_4$ at the electrode 11 is also negative so that the potential below the electrode 11 increases. Since the barrier below the electrode 12 is slightly lower than below the electrode 10, the charge flows into the region 18 and causes there an output signal Vo to be measured by the source follower. The signal value is represented by Vs.

For reading the signal, the whole time interval between the clock pulses $\phi_r$ is available in that the whole signal is transferred undivided in the region 18 at an instant which is determined by $\phi_4$. For comparison herewith, FIG. 2b shows the situation which occurs in a usual output structure in which the electrode 11 has the same or approximately the same dimensions as the electrodes 3–10. In this case a small part of the charge can flow away when electrode 11 ($\phi_4$) becomes positive and electrode 9 ($\phi_2$) becomes negative due to the slightly lower voltage at electrode 12. (t6). Before the electrode 10 ($\phi_3$) becomes negative, first the region 18 must be reset (t7). Only then can the negative clock voltage be applied to the electrode 10 ($\phi_3$) (t8). With a maximum charge packet, half of the charge packet now flows to the region 18. The remainder of the charge is transferred at t9 when $\phi_4$ becomes negative. So the signal comes into the output region 18 divided in time. As a result of this the available time interval in which reading can be carried out is smaller. Moreover, measures should be taken to derive the signal from the output voltage Vo. In contrast herewith the whole charge packet in the device according to the invention is transferred at an instant which is determined only by the clock voltage at the electrode 11.

It will be apparent that the invention is not restricted to the embodiment described but that many variations are possible to those skilled in the art without departing from the scope of this invention. For example, the device may also be used advantageously in surface-charge coupled devices. Furthermore, the capacitance of the electrode 11 can also be increased in manners other than by increasing the dimensions, whether of not in combination with each other, for example, by means of local doping of the semiconductor body, the thickness of the oxide layer, or by locally providing a dielectric differing from oxide (for example silicon nitride) having larger dielectric constant.

What is claimed is:

1. A semiconductor device comprising a four-phase charge-coupled device having a semiconductor body with a major surface, which comprises a reading stage and a row of electrodes adjacent said surface to which clock voltages can be applied for storing and transferring electrical charge packets, which electrodes are arranged in groups of four, the first electrode of each group being connected to a first clock line, the second electrode being connected to a second clock line, the third electrode being connected to a third clock line, and the fourth electrode being connected to a fourth clock line, the last electrode of the row being connected to a separate connection and being provided adjacent said reading stage, means for applying four-phase clock voltages having wave forms such that, during operation, a potential well is induced in the semiconductor body which extends below at least two neighboring electrodes so that the size of the maximum charge packet which can be stored and transported is determined by the area of two adjacent electrodes, the capacitance of said reading stage being sufficiently large to store this maximum charge packet, the penultimate electrode before the reading stage being at least twice the area of each of the electrodes before it and forming with the underlying part of the semiconductor body a capacitance which is also sufficiently high to store said maximum charge packet, said penultimate electrode being connected to one of said clock lines, and means for applying a voltage to said last electrode of the row such that below the last electrode a potential barrier is induced which causes each charge packet which arrives below the penultimate electrode to be stored only below this penultimate electrode during a selected period before being transferred to the reading stage.

2. A semiconductor device as claimed in claim 1, characterized in that the penultimate electrode of the row of electrodes forms with the underlying semiconductor body a large capacitance than that of said two adjacent electrodes.

3. A semiconductor device as claimed in claim 2, characterized in that the electrodes which are present before the penultimate electrode are approximately equally large in area and that the penultimate electrode is at least two times larger in area than the electrodes before it.

4. A semiconductor device as claimed in claim 3, characterized in that the penultimate electrode is at most approximately three times larger in area than the electrodes present before the penultimate electrode.

5. A semiconductor device as claimed in claim 1, 2, 3 or 4, characterized in that said four clock lines are connected to means for applying the clock voltages to the electrodes, the clock voltages being applied to adjacent electrodes overlapping each other at least 90° in phase.

* * * * *